(12) United States Patent
Bachman et al.

(10) Patent No.: US 8,810,341 B2
(45) Date of Patent: Aug. 19, 2014

(54) MAGNETICALLY ACTUATED MICRO-ELECTRO-MECHANICAL CAPACITOR SWITCHES IN LAMINATE

(75) Inventors: Mark Bachman, Irvine, CA (US); Guann-Pyng Li, Irvine, CA (US); Yang Zhang, Irvine, CA (US); Minfeng Wang, Irvine, CA (US); Sung Jun Kim, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/286,120

(22) Filed: Oct. 31, 2011

(65) Prior Publication Data

US 2012/0103768 A1 May 3, 2012

Related U.S. Application Data

(60) Provisional application No. 61/408,440, filed on Oct. 29, 2010, provisional application No. 61/408,410, filed on Oct. 29, 2010.

(51) Int. Cl.
*H01H 51/22* (2006.01)
*H01H 50/00* (2006.01)

(52) U.S. Cl.
CPC ....... *H01H 50/005* (2013.01); *H01H 2050/007* (2013.01); *B81B 2201/01* (2013.01); *B81B 2203/0109* (2013.01)
USPC ............................................ 335/78; 200/181

(58) Field of Classification Search
CPC ............ H01H 59/0009; H01H 1/0036; H01H 50/005; H01H 2057/006; B81B 2201/014; B81B 2203/0118; B81B 3/0008; B81B 3/0109; B81B 2203/0109; B81B 2203/127
USPC ............................................. 335/78; 200/181
See application file for complete search history.

(56) References Cited

U.S. PATENT DOCUMENTS

| | | | | |
|---|---|---|---|---|
| 5,475,353 A | * | 12/1995 | Roshen et al. | 335/78 |
| 6,084,281 A | * | 7/2000 | Fullin et al. | 257/422 |
| 6,094,116 A | * | 7/2000 | Tai et al. | 335/78 |
| 6,894,592 B2 | | 5/2005 | Shen et al. | |
| 7,342,473 B2 | | 3/2008 | Joung et al. | |
| 7,372,349 B2 | * | 5/2008 | Wheeler et al. | 335/78 |
| 2003/0001704 A1 | * | 1/2003 | Shen et al. | 335/78 |
| 2004/0113727 A1 | * | 6/2004 | Kawai | 335/78 |
| 2008/0170727 A1 | | 7/2008 | Bachman et al. | |
| 2008/0283180 A1 | | 11/2008 | Bachman et al. | |

* cited by examiner

*Primary Examiner* — Bernard Rojas
(74) *Attorney, Agent, or Firm* — One LLP

(57) ABSTRACT

Magnetically actuated micro-electro-mechanical capacitor switches in laminate are disclosed. According to one embodiment, an apparatus comprises a first layer comprising a coil and magnetic element, the magnetic element made from one of nickel and iron; a second layer comprising a flexible member, wherein a permanent magnet is attached to the flexible member; a conductive plate having an insulating dielectric coating, the conductive plate attached to one of the flexible member or a magnet; and a third layer comprising a transmission line and magnetic material, wherein the transmission line comprises one or more of a signal conductor and one or more ground conductors in near proximity.

11 Claims, 6 Drawing Sheets

MAGNETICALLY ACTUATED MICRO-ELECTRO-MECHANICAL CAPACITOR SWITCHES IN LAMINATE

The present application claims the benefit of and priority to U.S. Provisional Application No. 61/408,440 titled "Magnetically Actuated Micro-Electro-Mechanical Capacitor Switches in Laminate," filed on Oct. 29, 2010, and to U.S. Provisional Application No. 61/408,410 titled "Method of Integrating Precision Components in Laminate Micro-Devices," filed on Oct. 29, 2010, both of which are hereby incorporated by reference in their entirety.

FIELD

The embodiments described herein relate generally to capacitive switches and, more particularly, to laminate materials and methods that facilitate the formation of magnetically actuated micro-electro-mechanical capacitor switches in laminate.

BACKGROUND INFORMATION

Micro-electro-mechanical systems (MEMS) devices that change the capacitance of an electronic capacitor have great utility in radio frequency (RF) applications because they provide ability to change the capacitance of a circuit element, thus changing the electronic properties of the circuit. A number of efforts have been made to build miniaturized MEMS capacitive devices that switch between two states of capacitance utilizing thin film manufacturing techniques that are similar to the semiconductor manufacturing process. These devices share a common design where a first conductive plate is actuated to move from a first stable position to a second stable position, closer to a second plate, forming a parallel plate capacitor. The second metal carries the electrical signal. Because the device has only two stable states, and thus two capacitances, it is known as a two-state capacitive switch or simply a capacitive switch. Capacitive switches designed and made accordingly suffer from poor performance and are not capable of switching signals having large power.

The performance is limited by several factors. First, the devices are manufactured on a silicon substrate. Silicon is "lossy" meaning that it is known to absorb energy from radio waves, and it is also slightly conductive, thus allowing some leakage of radio energy through the substrate. Thus, capacitive switches made on silicon exhibit poor isolation and high loss. In addition, these devices are typically made with the first movable plate element constructed of a thin membrane of metal, typically less than 1 micrometer thick, which is pulled towards the second plate via electrostatic attraction. A thin dielectric coating on the second plate prevents direct short circuiting between the two plates, allowing the two plates to form a capacitor. To produce enough electrostatic actuation, a voltage must be formed between the two plates, typically 40 volts or more. As a result, the plates must be manufactured close together (typically a few microns separation), and the membrane must be very thin and easy to move. When actuation of the membrane occurs, the voltage must be maintained in order for the switch to stay latched in its actuated state.

MEMS capacitive switches for high power applications are difficult to design using conventional silicon technology. Silicon MEMS devices (and their close variants, such as electroformed metal devices) generally result in closely spaced, fragile elements. Most switches use electrostatic actuation to move the switch arm into contact with the mating electrical contact. This can only be achieved if the switch arm is close to the actuating mechanism, and if the actuation force is small. These requirements may be acceptable for low power (<1 W) applications where close proximity has little deleterious effect. However, for high power applications, it is unacceptable. Power coupling across the small gap between conductors is appreciable at high power. Self charging occurs at high power resulting in self actuating switches (the "hot switch" effect), and high power applications require that high current be passed through the conducting elements, which can destroy the thin membranes used in typical electrostatic RF MEMS devices.

Silicon devices can result in power losses through a lossy substrate, which for high power applications can result in heating and device failure, as well as degradation in performance. Furthermore, nearly all micro-machined devices must eventually be placed in a protective housing so that electrical connections can be made to the devices, and to protect the devices. This is troublesome for RF MEMS devices because they are fragile and because the electrical connections have an unknown effect on the device impedance.

SUMMARY

Magnetically actuated micro-electro-mechanical capacitor switches in laminate are disclosed. According to one embodiment, an apparatus comprises a first layer comprising a coil and magnetic element, the magnetic element made from one of nickel and iron; a second layer comprising a flexible member, wherein a permanent magnet is attached to the flexible member; a conductive plate having an insulating dielectric coating, the conductive plate attached to one of the flexible member or the magnet; and a third layer comprising a transmission line and magnetic material, wherein the transmission line comprises one or more of a signal conductor and one or more ground conductors in near proximity.

The systems, methods, features and advantages of the invention will be or will become apparent to one with skill in the art upon examination of the following figures and detailed description. It is intended that all such additional methods, features and advantages be included within this description, be within the scope of the invention, and be protected by the accompanying claims. It is also intended that the invention is not limited to require the details of the example embodiments.

BRIEF DESCRIPTION

The accompanying drawings, which are included as part of the present specification, illustrate the presently preferred embodiment and, together with the general description given above and the detailed description of the preferred embodiment given below, serve to explain and teach the principles of the present invention.

Figure 1:
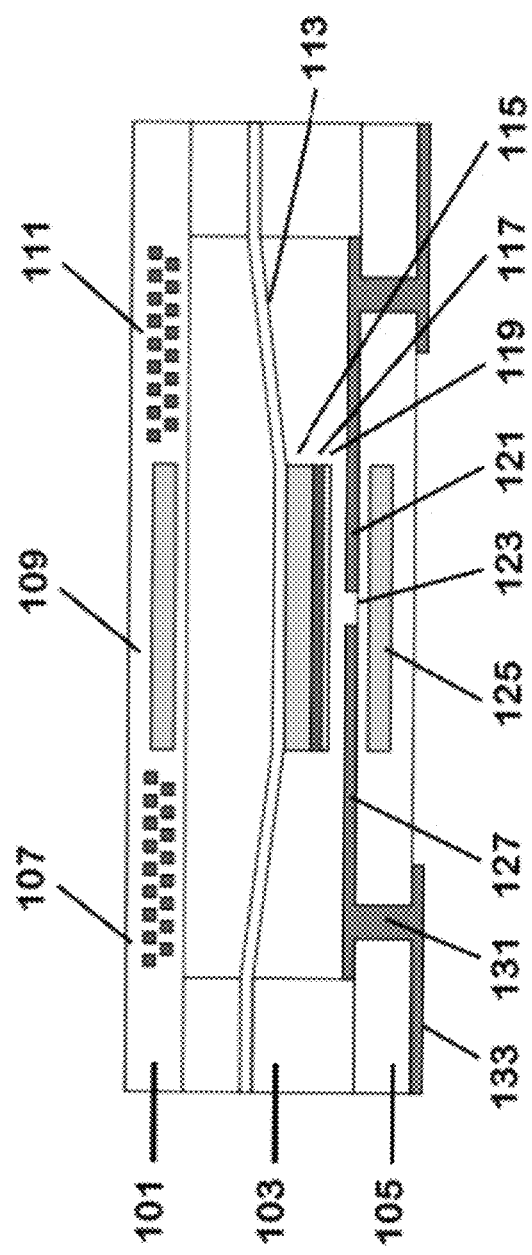
FIG. 1 illustrates an exemplary cross section view of an embodiment of the present system.

It should be noted that the figures are not necessarily drawn to scale and that elements of similar structures or functions are generally represented by like reference numerals for illustrative purposes throughout the figures. It also should be noted that the figures are only intended to facilitate the description of the various embodiments described herein. The figures do not necessarily describe every aspect of the teachings disclosed herein and do not limit the scope of the claims.

DETAILED DESCRIPTION

Magnetically actuated micro-electro-mechanical capacitor switches in laminate are disclosed. According to one embodiment, an apparatus comprises a first layer comprising a coil and magnetic element, the magnetic element made from one of nickel and iron; a second layer comprising a flexible member, wherein a permanent magnet is attached to the flexible member; a conductive plate having an insulating dielectric coating, the conductive plate attached to one of the flexible member or the magnet; and a third layer comprising a transmission line and magnetic material, wherein the transmission line comprises one or more of a signal conductor and one or more ground conductors in near proximity.

The embodiments described herein are directed to the design of capacitive switches with footprints of less than 25 mm². The capacitive switches handle up to 100 W of radio frequency (RF) power. The embodiments also include the use of three separate functional layers, and the use of laminate materials for manufacturing of the switch. The methods described herein relate to methods of manufacturing the capacitive switch devices directly within or on any of the following: lead frames, substrates, microelectronic packages, printed circuit boards, flex circuits, and rigid-flex materials. The embodiments refer to several techniques disclosed in U.S. application Ser. No. 11/956,756 titled "Acoustic Substrate" and U.S. application Ser. No. 12/112,925 titled "Methods of manufacturing microdevices in laminates, lead frames, packages, and printed circuit boards", both of which are incorporated herein by reference in their entirety.

One embodiment of the present disclosure includes a small switch that has an electromagnetic actuator and a movable plate that changes the capacitance of a conductive line when actuated.

According to one embodiment, the capacitive switch of the present disclosure displays the following features:

1. A low cost construction, based on the bonding of laminates and foils;
2. A magnetically actuated mechanism, wherein current is used to actuate the device, requiring low voltage (less than 5 V);
3. Latched operation wherein power is not needed to maintain any state in the capacitive switch after actuation;
4. An ability to handle high signal power signals in excess of 10 W signals on a 50 Ohm transmission line;
5. An ability to handle high signal voltages, in excess of 100 V signals on a 50 Ohm transmission line; and
6. Performance that is not highly sensitive to temperature.

According to one embodiment, the capacitive switch of the present disclosure comprises a first layer consisting of a coil and magnetic element, such as nickel or iron, a second layer consisting of a flexible member with a permanent magnet attached to it, a conductive plate with an insulating dielectric coating attached to the flexible member or magnet which is intended to be brought in close proximity to the transmission line, and a third layer comprising a transmission line and magnetic material.

FIG. 1 illustrates an exemplary cross section view of an embodiment of the present system. A first layer ("top layer") (101) acts as both a package cap and a structural element for the device. The first layer (101) also holds coils that are used to actuate a magnet and also a magnetic plate used to latch the magnet. This first layer (101) may be constructed from any suitable material. In the preferred embodiment, the material is a laminate that is commonly used by the printed circuit board and microelectronic packaging industry such as FR-4, Rogers, or BT.

A second layer ("middle layer") (103) contains a moving part of the device, a flexing element such as a spring or flexure that holds the magnet and a conducting plate. The second layer (103) may be constructed from any suitable material. In a preferred embodiment, the material is a laminate commonly used by the printed circuit board and microelectronic packaging industry such as FR-4, Rogers, or BT.

A third layer ("bottom layer") (105) holds transmission lines and electrical pads needed to form a capacitive coupling to the moving plate. The material for the third layer (105) is preferably selected to optimize the RF performance of the device in its intended application. The preferred embodiment uses a laminate that is commonly used by the printed circuit board and microelectronic packaging industry such as FR-4, Rogers, or BT.

The top or first layer (101) contains an electrical coil (107, 111) which is embedded within several laminate layers sandwiched together. According to one embodiment, the coil is manufactured from industry standard conductors such as copper and in other embodiments is manufactured as several overlapping coils to increase magnetic field output. The first layer (101) also contains a magnetic plate (109) designed to hold the moving magnet in the "off" state when it is near the top layer. This plate can be sandwiched in the laminate or may be external to it. The magnetic plate may be manufactured from a plurality of ferromagnetic metals; and the preferred embodiment uses nickel. The magnetic material may be assembled on to the top layer (101) or may be electrochemically formed on to the laminate material.

The middle layer (103) is open in its central region and holds a flexible structure such as a flexure or spring (113). The flexible structure (113) may be made from any appropriate thin material or foil; the preferred embodiment utilizes an engineering polymer such as polyimide. The flexible structure (113) holds a magnet (115) which moves in the presence of an applied external field which results when a current is passed through the coils (107, 111) contained in the first layer (101). The preferred magnet is a high strength rare earth magnet, such as neodymium. The magnet holds a conductive plate (117) which is prepared to be flat. When the device is actuated, the conductive plate (117) acts as one of two parts of a parallel plate capacitor. In some embodiments, the conductive plate has an insulating dielectric film (119) designed to prevent the plate from making electrical contact with the transmission line.

The bottom layer (105) holds a transmission line (121) made of conductive material and is designed to provide efficient transfer of RF signals. The transmission line (121) may be composed of a signal conductor and one or more ground conductors in near proximity, or a signal conductor that is separated into two parts (121, 127), representing an open circuit (123).

Also embedded in the bottom layer (105) is a ferromagnetic material (125) which is similar to the ferromagnetic material in the top layer (101). The ferromagnetic material (125) serves to latch the magnet (115) when it is actuated in to the "on" position.

The conductive transmission line (121) is passed through the bottom layer (105) by one or more conductive vias (131) manufactured by standard processes common to printed circuit boards and microelectronic packaging. Conductive metal pads (133) on the bottom of the bottom layer (105) allow the device to be connected to an external circuit.

In their entirety, the layers (101, 103, 105) serve to provide mechanical and electrical function, as well as providing the packaging for the device.

The present device is actuated by energizing the coils (107, 111) with current, which forms a magnetic field which produces a force and torque on the magnet (115). This in turn forces the flexible member (113) to move, bringing the conductive plate (117) near the transmission line (121), forming the "on" state. When the magnet is close to the third layer (105), it is attracted to the magnetic material (125) in the third layer and remains in its "on" state. This is referred to herein as magnetic latching.

When the current in the coils (107, 111) are reversed, the magnet and flexible member are pushed in the opposite direction, away from the transmission line and towards the first layer (101), forming the "off" state. When the flexible member and magnet are pushed far enough, the magnet (115) is attracted to the magnetic material in the first layer (109) and it stays positioned in this "off" state. This is referred to herein as magnetic latching. After latching in the "off" state, current is no longer needed to maintain the state.

When the switch is actuated into its "off" state, the insulated conductive plate (117) is moved far from the transmission line (121), greater than 10 micrometers, minimizing any external capacitive coupling between the conductive elements on the transmission line. The large distance of the conducting plate from the transmission line produces superior performance for the device, and reduces the possibility of self-actuation of the switch by electrostatic forces.

When the switch is actuated into its "on" state, the insulated conductive plate (117) is moved into contact or near contact with the transmission line (121), forming a metal-insulator-metal capacitor. In the case of two signal conductors that form an open signal line (as shown in FIG. 1), the plate (117) forms a capacitive coupling between the first and second signal conductors (121, 127). This is referred to herein as an in-line capacitive switch. In the case of a signal conductor and a ground conductor, this forms a capacitive coupling between the signal conductor and ground conductor. This is referred to herein as a shunt capacitor switch.

The present device allows the use of thick metals, produces large stroke, large forces, and latching operation. These features allow the device to have high performance, handle large signal voltage, and switch large signal power while utilizing low voltage for actuation and consuming little energy.

Figure 2:
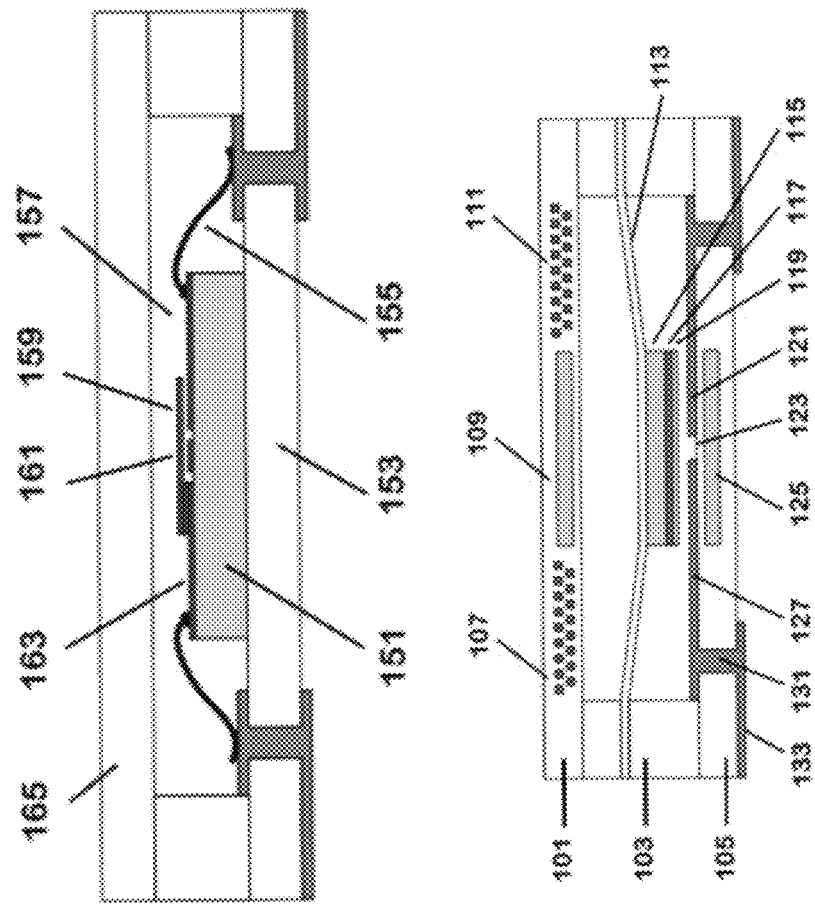
FIG. 2 illustrates exemplary features of a conventional RF MEMS device manufactured in silicon, show from a cross section view.

FIG. 2 illustrates exemplary a comparison of features of a conventional RF MEMS device manufactured in silicon, shown from a cross section view. In the conventional approach shown in the upper of FIG. 2, a MEMS device is built on a silicon substrate (151) which is attached to a package substrate (153). Electrical contacts are made to the silicon by wire bonding (155). A transmission line (157) is fabricated on an insulating film grown on the silicon. An electromechanical movable contact is built using a thin film of metal (159), typically less than 1 micrometer thick. The metal is commonly designed as a bridge or cantilever that sits very close to the signal line, typically less than 10 micrometers. Beneath the movable contact is an electrostatic pad (161) that is used to actuate the device by electrostatic attraction. When the movable contact is brought down by the electrostatic attraction, capacitive coupling can be made to connect the signal line with a second conductor (163) which may represent a second signal line or a ground line. The entire device is placed in a protective package (165) which protects it from environmental damage.

The conventional design suffers from several problems. Silicon (151) is a lossy substrate which absorbs some of the signal, reducing performance and producing heat. The wire bonds (155) introduce unknown capacitances and inductances into the device, making impedance matching difficult. The thin metal film (159) is very close to the signal line which results in capacitive leaking and which can result in self actuation from self charging when the signal voltage is large. Furthermore, the thin film is fragile and cannot handle large temperatures that can occur when switching large currents. Electrostatic attraction (161) requires large voltages, typically 20V-40V, which are not desirable in most modern electronics circuits. The conventional device must still be placed in a protective package (165) which represents a significant cost in the manufacturing. MEMS packaging is difficult and slow since the components to be packaged are extremely fragile prior to packaging.

Figure 3:
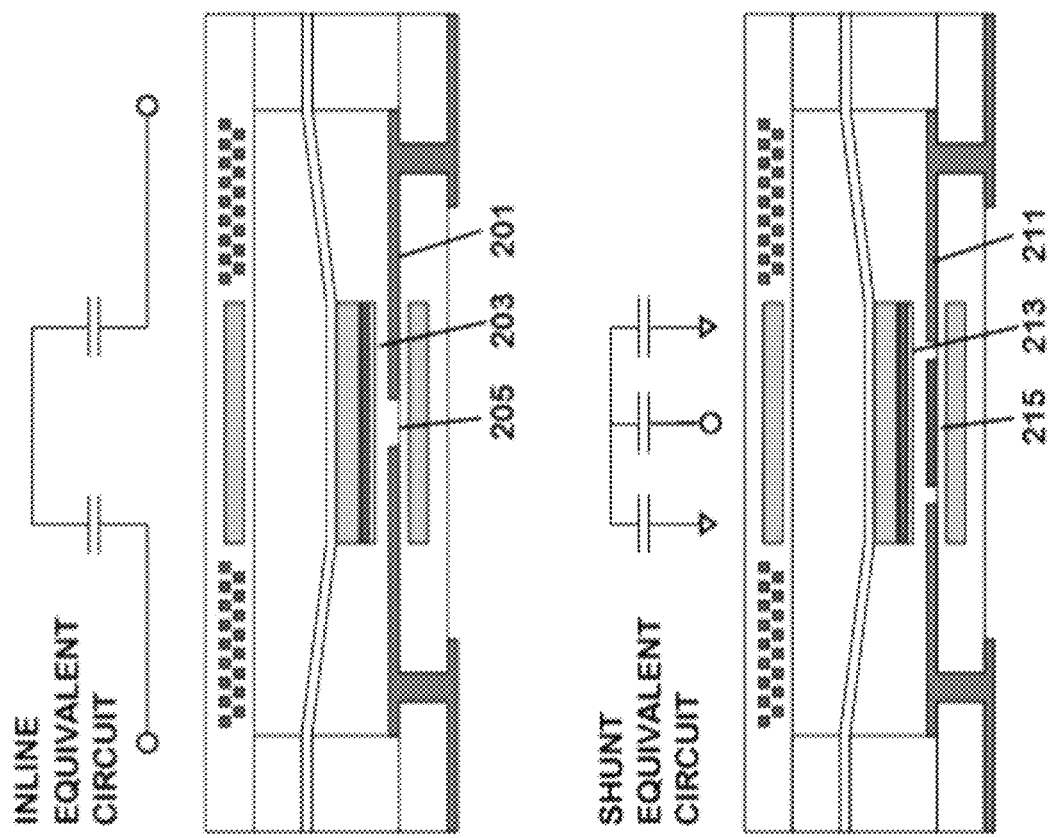
FIG. 3 illustrates exemplary functions and equivalent circuit of a device according to one embodiment of the present system.

FIG. 3 illustrates exemplary functions and equivalent circuit of a device according to one embodiment of the present system. In one embodiment, a signal line (201) couples to a capacitive plate (203) which in turns couples to a second signal line (205), thus producing two in-line capacitors (in-line configuration). In a second embodiment, a signal line (215) couples to a capacitive plate (213) which in turn couples to a ground line (211), thus forming two capacitors to ground (shunt configuration).

Figure 4:
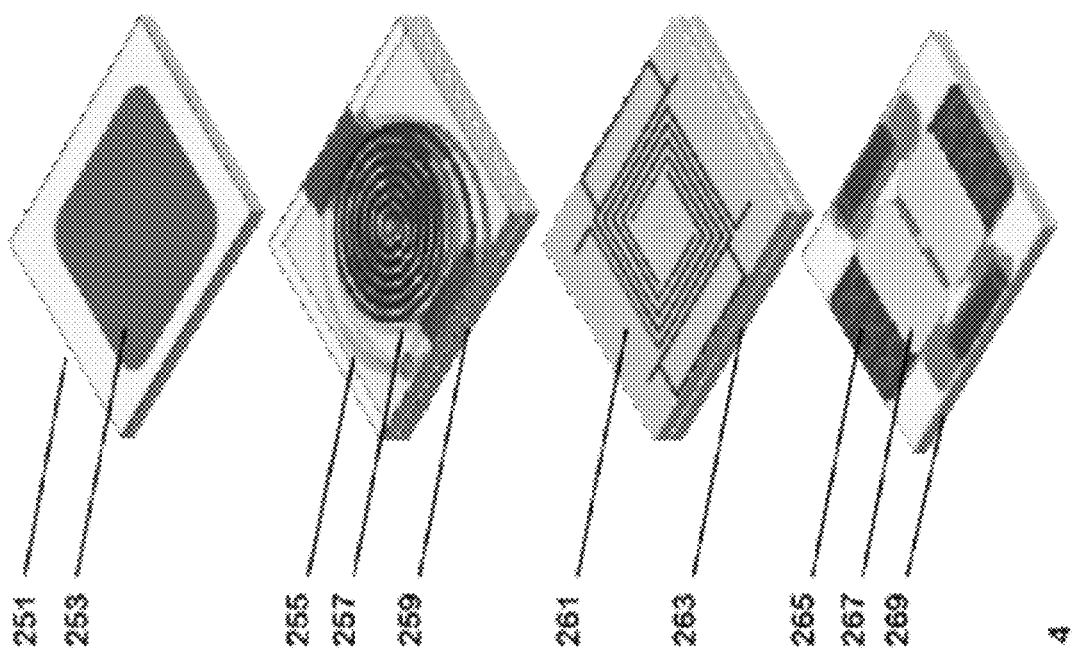
FIG. 4 illustrates exemplary layers of a device and manufacture thereof, according to one embodiment of the present system.

FIG. 4 illustrates exemplary layers of a device and manufacture thereof, according to one embodiment of the present system. A first portion of the top layer contains a laminate material (251) and ferromagnetic material (253). A second portion of the top layer contains laminate (255) with conductive coils (257), and a structural laminate (259).

A flexible layer (261) is designed to reliably hold and move a magnet and plate. In a preferred embodiment, the flexible material is formed from polymide and made into a flexure (261) by cutting the material into geometric shapes using a laser cutting tool. The flexure (261) is held in place by laminate material (263) that has been routed to have an opening in its center, allowing movement.

A signal line (265) is formed on the bottom laminate layer containing electrical connections to pads on the other side of the laminate. Special contact pads (267) may be formed to improve electrical coupling across the capacitor. The bottom layer is made from performance laminate (269) designed to optimize the RF performance of the present device in its intended application.

Figure 5:
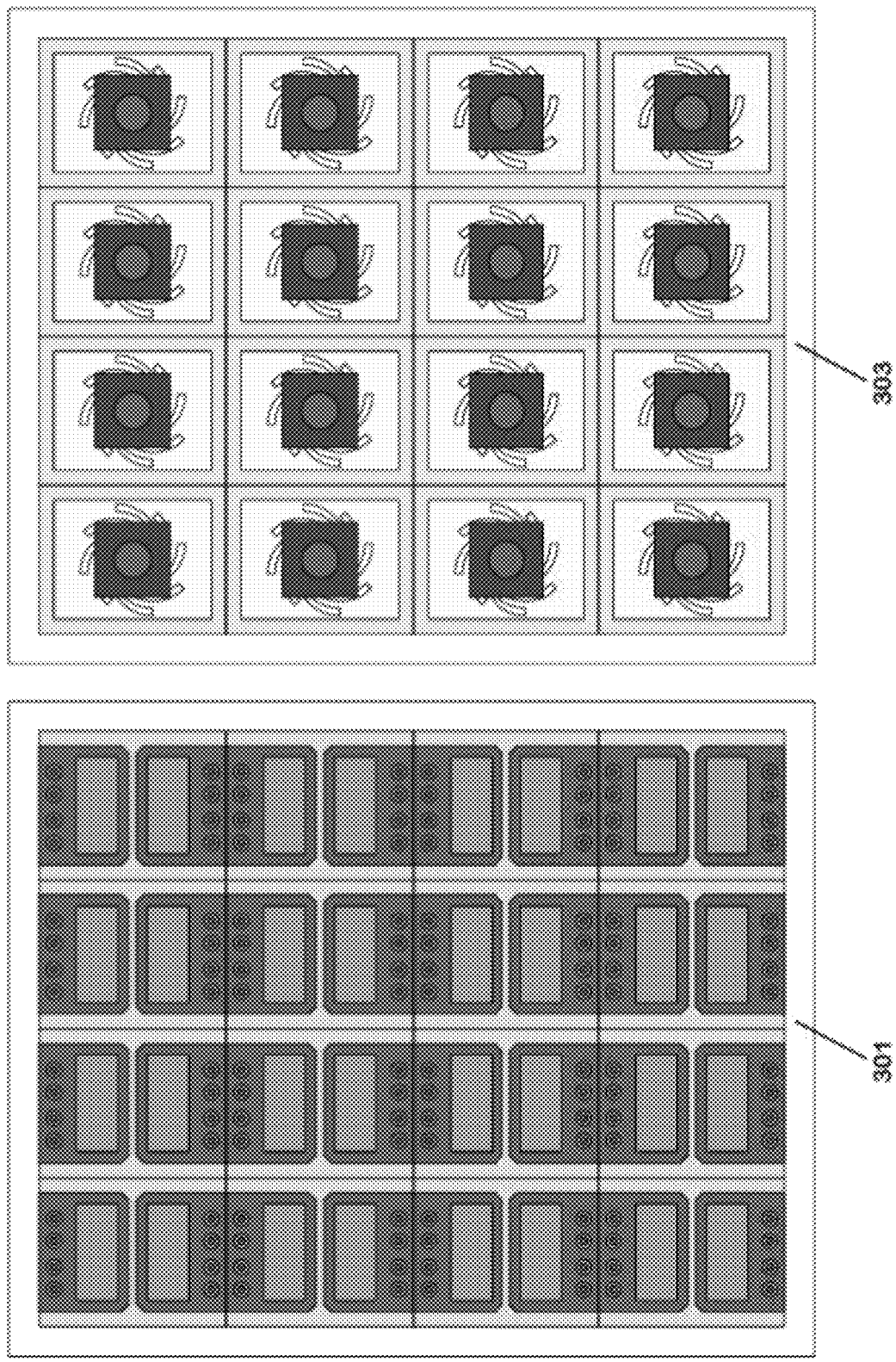
FIG. 5 illustrates an exemplary panel level manufacturing afforded by laminate-based manufacturing, according to one embodiment of the present system.

FIG. 5 illustrates an exemplary panel level manufacturing afforded by laminate-based manufacturing, according to one embodiment of the present system. This illustration shows two layers, the bottom layer containing a signal line (301) and the middle layer containing a magnet and conductive plate (303). Panel fabrication allows batch fabrication and parallel fabrication of parts of the present device, and allows the layers to be manufactured separately by separate facilities. The panels are bonded together to form a single panel consisting of multiple devices. The devices are singulated from the panels for use in electrical circuits. An alternate configuration (not shown) includes building other circuits on the panels and allowing the RF MEMS capacitive switches to be embedded within the resulting circuit.

FIG. 5 illustrates the use of printed circuit boards and laminates to build RF MEMS switch devices. Laminates are ideally suited to the needs of high power RF switches because they allow the creation of rugged, highly conductive devices, and they allow relatively easy integration of alternative technologies such as magnetic components for electro-magnetic actuation.

The method of utilizing laminates allows fabrication of each layer independently on individual laminate panels, each representing a separate layer of the device. A single laminate panel may contain hundreds or thousands of components for the device. Key features of each layer are fabricated by various means, including lithography, etch, milling, machining, routing, embossing, electroplating, electroforming, assembly, and other methods common to the printed circuit board and electronic packaging industry.

Figure 6:
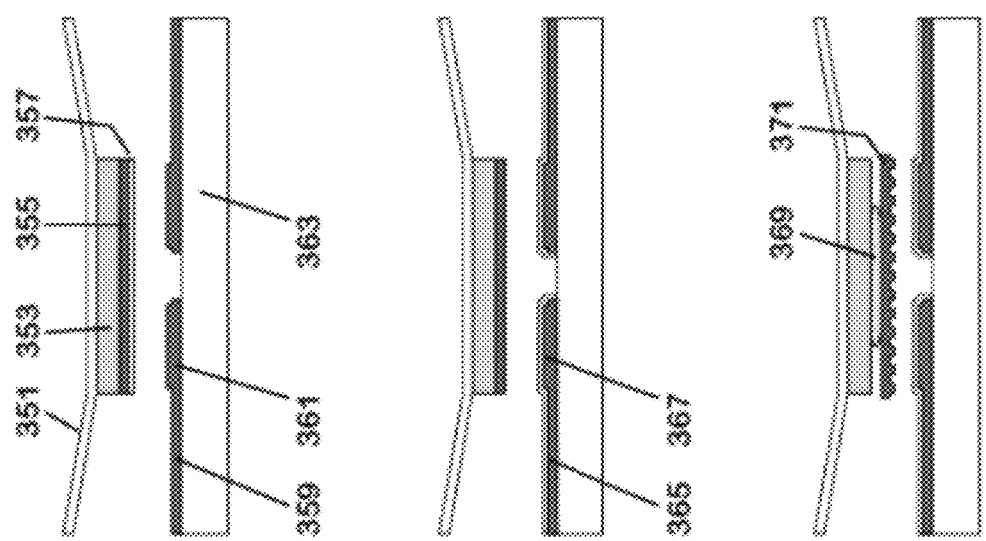
FIG. 6 illustrates an exemplary use of a second microfabricated device according to one embodiment of the present system.

FIG. 6 illustrates an exemplary use of a second microfabricated device according to one embodiment of the present system. According to one embodiment, the flexure (351) holds a magnet (353) which has a metal layer attached or grown on it (355). The metal layer (355) may be produced separately and attached to the magnet, or may be grown directly on the magnet, such as by electroplating or electroforming. The metal layer (355) has a thin insulating dielectric layer grown over it (357) to prevent direct contact between the metal layer (355) and the signal line (359). The metal layer (355) forms the top capacitive plate. The signal line may have special pads produced on its surface (361) in order to enhance electrical coupling between the signal line and the top capacitive plate. These pads may be slightly raised, polished, and coated with a second metal in order to improve robustness and resistance to oxidation. In the preferred embodiment, these pads are polished gold. The signal line sits on top of a performance laminate (363) designed to optimize performance of the device for its intended application.

In another embodiment, the signal line (365) is coated with a thin insulating dielectric (367), eliminating the need to coat the top capacitive plate with dielectric.

In another embodiment, a specially prepared plate (371) is manufactured separately and attached to the movable structure or magnet (369).

In the preferred embodiment, the plate (371) is prepared with a plurality of groves and microstructures. These serve to allow customization of the contact area, and thus the capacitance of the device without redesigning the rest of the structure. Furthermore, the use of tiny posts and structures improves the ability of the plate (371) to make intimate contact with the signal line, since small imperfections or dust are less problematic than for a full single plate. In the preferred embodiment, the plate (371) is attached by a flexible adhesive which allows the plate to move and rock slightly in order to make good contact with the pads when actuated down. The flexible adhesive also serves to absorb some of the shock of actuation.

The capacitive switches described herein are intended to be used in radio applications such as impedance matching circuits, tuning circuits, phase shifters, routing circuits, power control circuits, phase shifter circuits, resonators, line switches, attenuators, isolators, reconfigurable antennas.

While the invention is susceptible to various modifications, and alternative forms, specific examples thereof have been shown in the drawings and are herein described in detail. It should be understood, however, that the invention is not to be limited to the particular forms or methods disclosed, but to the contrary, the invention is to cover all modifications, equivalents and alternatives falling within the spirit and scope of the appended claims.

In the description above, for purposes of explanation only, specific nomenclature is set forth to provide a thorough understanding of the present disclosure. However, it will be apparent to one skilled in the art that these specific details are not required to practice the teachings of the present disclosure.

The various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter.

Magnetically actuated, latching micro-electro-mechanical capacitor switches in laminate have been disclosed. It is understood that the embodiments described herein are for the purpose of elucidation and should not be considered limiting the subject matter of the disclosure. Various modifications, uses, substitutions, combinations, improvements, methods of productions without departing from the scope or spirit of the present invention would be evident to a person skilled in the art.

What is claimed is:

1. A device, comprising:
    a first layer comprising a coil and magnetic element, the magnetic element made from a ferromagnetic material;
    a second layer comprising a flexible member, wherein a permanent magnet is attached to the flexible member;
    a conductive plate having an insulating dielectric coating, the conductive plate attached to one of the flexible member or the magnet; and
    a third layer comprising a transmission line and magnetic material, wherein the transmission line comprises one or more of a signal conductor and one or more ground conductors in near proximity;
    wherein the second layer and the third layer are separate individual laminate structures; and
    wherein a gap between the conductive plate and the transmission line is greater than 10 micrometers.

2. The device of claim 1 wherein the flexible member of the device is actuatable by application of less than 5 Volts.

3. The device of claim 1 wherein the transmission line has an impedance of 50 Ohms.

4. The device of claim 1 wherein the device has a footprint of less than 25 $mm^2$.

5. The device of claim 1, wherein the device is configured to switch an electrical signal having greater than 100 Volts.

6. The device of claim 1, wherein the device is configured to switch an electrical signal with electrical current and voltage that correspond to greater than 10 Watts.

7. The device of claim 1, wherein the device is configured to switch an electrical signal with electrical current and voltage that correspond to greater than 100 Watts.

8. A method of actuating a capacitive switch, comprising:
    energizing coils in a first layer of the capacitive switch with a current;
    producing a force and a torque on a magnet of a second layer of the capacitive switch by forming a magnetic field;
    forming an on state by forcing a flexible member of the second layer of the capacitive switch to move, thereby bringing a conductive plate of the second layer of the capacitive switch near a transmission line of the capacitive switch, wherein a gap between the conductive plate and the transmission line is greater than 10 micrometers;

maintaining the on state by forcing magnetic latching, wherein the magnet is attracted to a magnetic material in a third layer of the capacitive switch, wherein the second layer and the third layer are separate individual laminate structures; and removing the energizing current in the coils.

9. The method of claim 8, further comprising reversing the current in the coils;

forming an off state by forcing the magnet and the flexible member in an opposite direction away from the transmission line and towards a first layer;

maintaining the off state, wherein the magnet is attracted to the magnetic material in the first layer; and de-energizing the coils of the capacitive switch by discontinuing current supply.

10. The method of claim 8, wherein the conductive plate is moved into contact or near contact with the transmission line, allowing coupling between the signal conductor and the ground conductor, thereby forming a capacitive coupling between the signal conductor and ground conductor.

11. The method of claim 8, wherein a configuration of the conductive plate is selected from a group consisting of a metallic coating on the magnet or flexible member, a separate metal component attached to the magnet or flexible member, and a micromachined component having a metallic coating attached to the magnet or flexible coating.

* * * * *